United States Patent
Hijzen et al.

(10) Patent No.: US 6,620,669 B2
(45) Date of Patent: Sep. 16, 2003

(54) MANUFACTURE OF TRENCH-GATE SEMICONDUCTOR DEVICES

(75) Inventors: Erwin A. Hijzen, Blanden (BE); Michael A. A. in't Zandt, Veldhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/152,208

(22) Filed: May 21, 2002

(65) Prior Publication Data

US 2002/0179950 A1 Dec. 5, 2002

(30) Foreign Application Priority Data

May 29, 2001 (GB) .............................................. 0113143

(51) Int. Cl.[7] ......................................... H01L 21/8238
(52) U.S. Cl. ..................... 438/206; 438/156; 438/209; 438/242; 438/259; 438/270
(58) Field of Search ........................ 257/301; 438/242, 438/209, 156, 259, 270, 206

(56) References Cited

U.S. PATENT DOCUMENTS

| | | | |
|---|---|---|---|
| 5,321,289 A | * 6/1994 | Baba et al. | 257/331 |
| 5,578,508 A | * 11/1996 | Baba et al. | 438/270 |
| 5,795,792 A | 8/1998 | Nishihara | 437/6 |
| 5,918,114 A | * 6/1999 | Choi et al. | 438/134 |

FOREIGN PATENT DOCUMENTS

WO 0169685 A2 9/2001 ........... H01L/29/78

* cited by examiner

Primary Examiner—Vu A. Le
Assistant Examiner—Doug Menz
(74) Attorney, Agent, or Firm—Steven R. Biren

(57) ABSTRACT

A vertical power transistor trench-gate semiconductor device has an active area (100) accommodating transistor cells and an inactive area (200) accommodating a gate electrode (25) (FIG. 6). While an n-type layer (14) suitable for drain regions still extends to the semiconductor body surface (10a), gate material (11) is deposited in silicon dioxide insulated (17) trenches (20) and planarised to the top of the trenches (20) in the active (100) and inactive (200) areas. Implantation steps then provide p-type channel-accommodating body regions (15A) in the active area (100) and p-type regions (15B) in the inactive area (200), and then source regions (13) in the active area (100). Further gate material (111) is then provided extending from the gate material (11) in the inactive area (200) and onto a top surface insulating layer (17B) for contact with the gate electrode (25). The channel profiles of the device are optimised by providing the p-type regions (15A) after the trench insulation (17), and voltage breakdown at the bottom corners of the trenches (20) is suppressed by providing the p-type regions (15B) in the inactive area (200).

14 Claims, 6 Drawing Sheets

MANUFACTURE OF TRENCH-GATE SEMICONDUCTOR DEVICES

This invention relates to a method of manufacturing a vertical power transistor trench-gate semiconductor device, and to such a device made by the method.

Such a semiconductor device is known in which the device comprises a semiconductor body with trenches extending into the semiconductor body from a surface thereof and an insulating layer provided between gate material in the trenches and the semiconductor body adjacent the trenches; wherein the device has an active transistor cell area, each transistor cell having source and drain regions which are separated by a channel-accommodating body region adjacent a trench-gate, and a source electrode contacting the source regions on the semiconductor body surface and being insulated from the gate material in the trenches; and wherein the device has an inactive area without source regions, said insulating layer extending from the trenches to provide a top surface insulating layer on the semiconductor body surface in the inactive area, further gate material extending from the gate material in the trenches in the inactive area and onto the top surface insulating layer, and a gate electrode contacting the further gate material.

U.S. Pat. No. 5,795,792 (Nishihara) discloses a device having the known features which we have defined above. The background art discussion in this U.S. patent document indicates that chip size reduction and performance improvement require reduction of trench widths, but that if trench width is reduced too much it can be difficult directly to form a contact with the gate material buried in the trench. It is therefore a generally practised approach to lead out the gate material from inside the trench to the main surface of the semiconductor substrate for contact with a gate electrode on that surface. This is in accordance with the feature we have described above wherein the device comprises further gate material extending from the gate material in the trenches in the inactive area and onto the top surface insulating layer, and a gate electrode contacting the further gate material. Nishihara is concerned with insulated-gate devices where the gate insulating layer (that is the insulating layer and the top surface insulating layer we have defined above) is a silicon oxide film, and there is a discussion of the further problem that conventional processing results in a thinning of this silicon oxide film just at the upper end corner portion of the trench where the gate material is led out from the trench to the main surface and that this thinning can greatly reduce the breakdown voltage of the silicon oxide film. The inventive disclosure of Nishihara concerns methods for increasing the silicon oxide thickness at this upper end corner portion of the trench. Both the conventional process acknowledged by Nishihara and the inventive process disclosed by Nishihara involve first providing the channel-accommodating body region with this conductivity type region also extending to underneath where the gate electrode will be, then forming the trenches and the gate insulating layer, then depositing gate material and patterning this gate material in one step so that it is in the trenches and is also led out to the main surface for contact with the gate electrode.

It is an aim of the present invention to provide an alternative and advantageous method both for providing the channel-accommodating body region and for providing contact to the gate electrode.

According to the present invention there is provided a method of manufacturing a vertical power transistor trench-gate semiconductor device having the known features which we have defined above; the method including the steps of:

(a) providing the semiconductor body with a first layer extending to the semiconductor body surface in the active and inactive areas, the first layer being of a first conductivity type suitable for the drain regions;

(b) forming the trenches extending into the first layer in the active and inactive areas;

(c) while the first layer still extends to the semiconductor body surface, providing the insulating layer in the trenches in the active and inactive areas, and providing the top surface insulating layer in the inactive area;

(d) depositing a first material in the trenches and planarising the first material to the top of the trenches in the active and inactive areas;

(e) after steps (c) and (d), forming a second layer extending from the semiconductor body surface in the active and inactive areas, the second layer being of a second conductivity type, opposite to the first conductivity type, suitable for the channel-accommodating body regions in the active area;

(f) after step (e), forming the source regions in the active area; and (g) also after step (e), providing the further gate material in the inactive area.

Forming the second layer in step (e) after providing the insulating layers in step (c) in the method of the present invention has advantages in optimising the channel profile of the device in operation, particularly in the case where these insulating layers are formed by oxidation of the semiconductor body first layer, as will be explained later in the description of embodiments of the invention.

The effect of having the second layer, which forms the channel-accommodating body regions in the active area, present in the inactive area underneath the gate electrode is to counteract the concentration of electric field at the bottom corners of the trenches in the inactive area which would otherwise occur with resulting disadvantageous reduction in breakdown voltage of the device in operation. This effect will be explained in more detail later in the description of embodiments of the invention. It seems that this effect of reducing the electric field at the bottom corners of the trenches in the inactive area would also be present in the structure disclosed in the Nishihara US patent, although this is not mentioned in this document whose inventive disclosure is concerned with breakdown voltage at the top corners of the trenches in the inactive area. For reasons which will be explained in the later description of embodiments of the invention, breakdown at the bottom corners of the trenches in the inactive area is a different problem from breakdown at the top corners of these trenches.

Thus the method of the present invention enables the second layer to be formed in the active area after forming the gate insulating layers in the trench-gate trenches so as to optimise the channel profile of the device, and enables this second layer to be formed at the same time in the inactive area so as to reduce the electric field at the bottom corners of the trenches in the inactive area.

As defined in claim 3, the first material which is deposited and planarised in step (d) may be the device gate material. In this case the device gate material and the device further gate material are provided in two separate steps, respectively (d) and (g), before and after forming the second layer in the active and inactive areas in step (e), this step (e) being after providing the insulating layer in the trenches and the top surface insulating layer in the inactive area in step (c).

Alternatively, as defined in claim 6, after step (e) and before step (g) the first material may be removed from the trenches, and in step (g) a second material may be deposited in the trenches and on the top surface insulating layer in the inactive area, the second material being patterned to provide the device gate material and the device further gate material. In this case the device gate material and the device further gate material are provided in a single step, step (g), again after forming the second layer in the active and inactive areas in step (e), this step (e) being after providing the insulating layers in step (c).

In both methods as described above, that is as defined in claim 3 and as defined in claim 6, preferably in step (c) the insulating layer in the trenches, the top surface insulating layer in the inactive area and a further top surface insulating layer in the active area are formed simultaneously, and the second layer is formed in step (e) using dopant implantation through the top surface insulating layer and through the further top surface insulating layer. In this case, the source regions may be formed in step (f) using dopant implantation through the further top surface insulating layer, the further top surface insulating layer being removed before providing the source electrode.

Embodiments of the present invention will now be described, by way of example, with reference to the accompanying diagrammatic drawings, in which.

Figure 1:
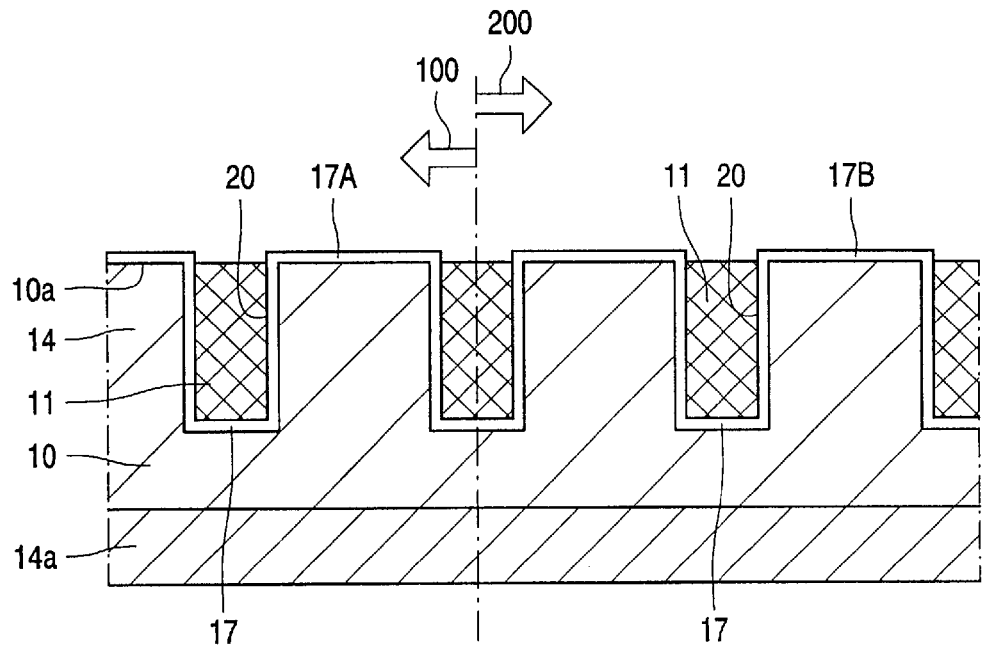
FIGS. 1, 3, 4 and 6 are a cross-sectional view of part of a semiconductor body at successive stages in the manufacture of a vertical power transistor trench-gate semiconductor device by a first example of a method in accordance with the invention, FIG. 6 showing a first example of part of a vertical power transistor in accordance with the present invention.

It should be noted that all the Figures are diagrammatic and not drawn to scale. Relative dimensions and proportions of parts of the drawings have been shown exaggerated or reduced in size, for the sake of clarity and convenience in the drawings. The same reference signs are generally used to refer to corresponding or similar features in different stages of manufacture and in modified and different embodiments.

Figure 6:
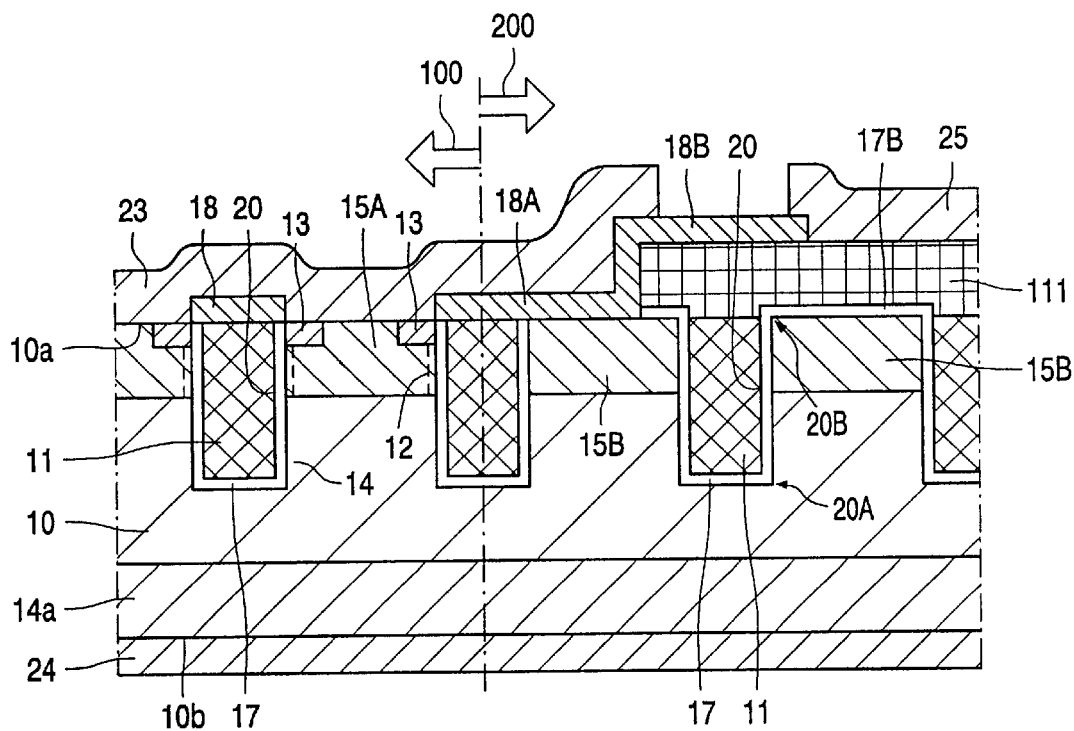

FIG. 6 illustrates an exemplary embodiment of a vertical trench-gate power transistor having an active area 100 accommodating transistor cells and an inactive area 200 accommodating a gate electrode. Trenches 20 extend into a semiconductor body 10 from a surface 10a thereof and an insulating layer 17 is provided between gate material 11 in the trenches 20 and the semiconductor body adjacent the trenches. In the active transistor cell area 100, each transistor cell has source and drain regions 13 and 14, respectively, of a first conductivity type (n-type in this example) which are separated by a channel-accommodating body region 15A of the opposite second conductivity type (i.e. p-type in this example) adjacent a trench-gate comprising gate material 11 in a trench 20. A source electrode 23 contacts the source regions 13 on the semiconductor body surface 10a in the active area 100 and is insulated from the gate material 11 in the trenches 20 by gate insulating overlayers 18. In the inactive area 200, without source regions 13, the insulating layer 17 extends from the trenches 20 to provide a top surface insulating layer 17B on the semiconductor body surface 10a, further gate material 111 extends from the gate material 11 in the trenches 20 and onto the top surface insulating layer 17B and a gate electrode 25 contacts the further gate material 111. The second conductivity type region extends to form regions 15B under the further gate material 111. The application of a voltage signal to the gate electrode 25 in the on-state of the device serves in known manner for inducing a conduction channel 12 in the region 15A in each transistor cell in the active area 100 and for controlling current flow in this conduction channel 12 between the source and drain regions 13 and 14.

The region 14 may be a drain-drift region formed by an epitaxial layer of high resistivity (low doping) on a substrate region 14a of high conductivity. This substrate region 14a may be of the same conductivity type (n-type in this example) as the region 14 to provide a vertical MOSFET, or it may be of opposite conductivity type (p-type in this example) to provide a vertical IGBT. The substrate region 14a is contacted at the bottom major surface 10b of the device body by an electrode 24, called the drain electrode in the case of a MOSFET and called the anode electrode in the case of an IGBT.

Figure 2:
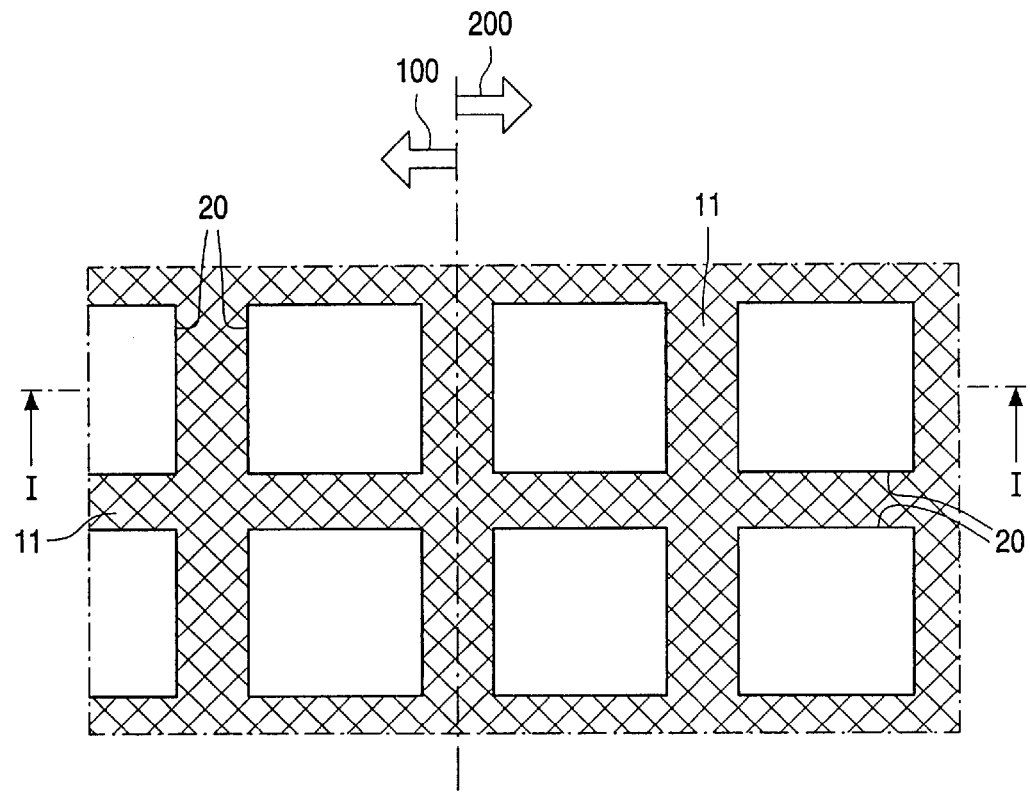
FIG. 2 is a plan view of the semiconductor body at the stage shown in FIG. 1, the line I—I indicating where the cross-section of FIG. 1 is taken.
Figure 3:
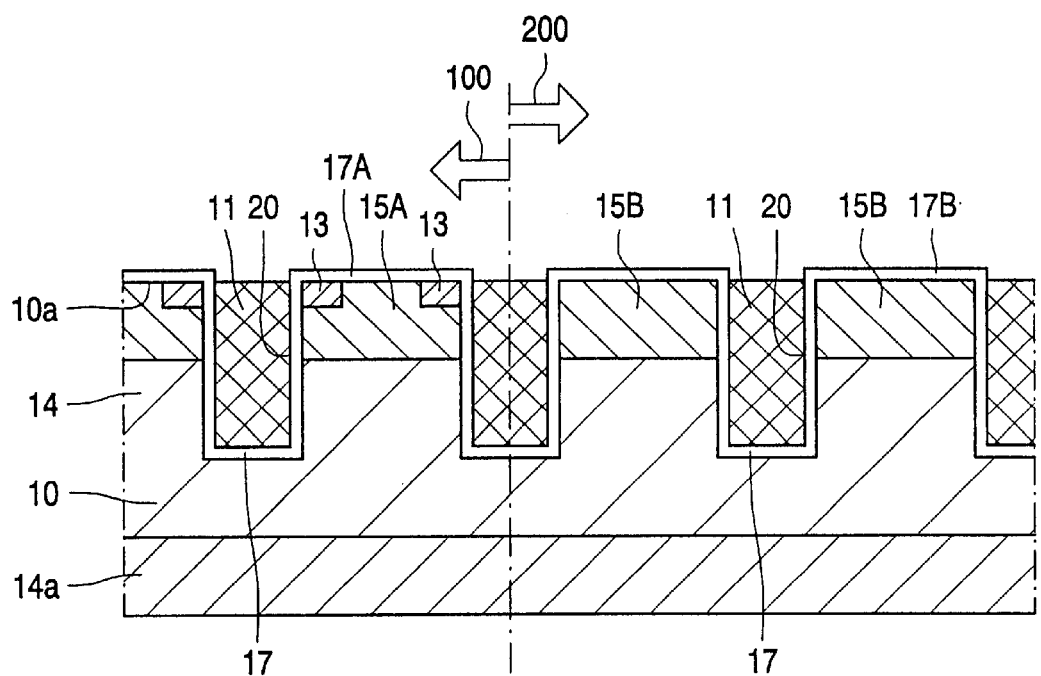
Figure 4:
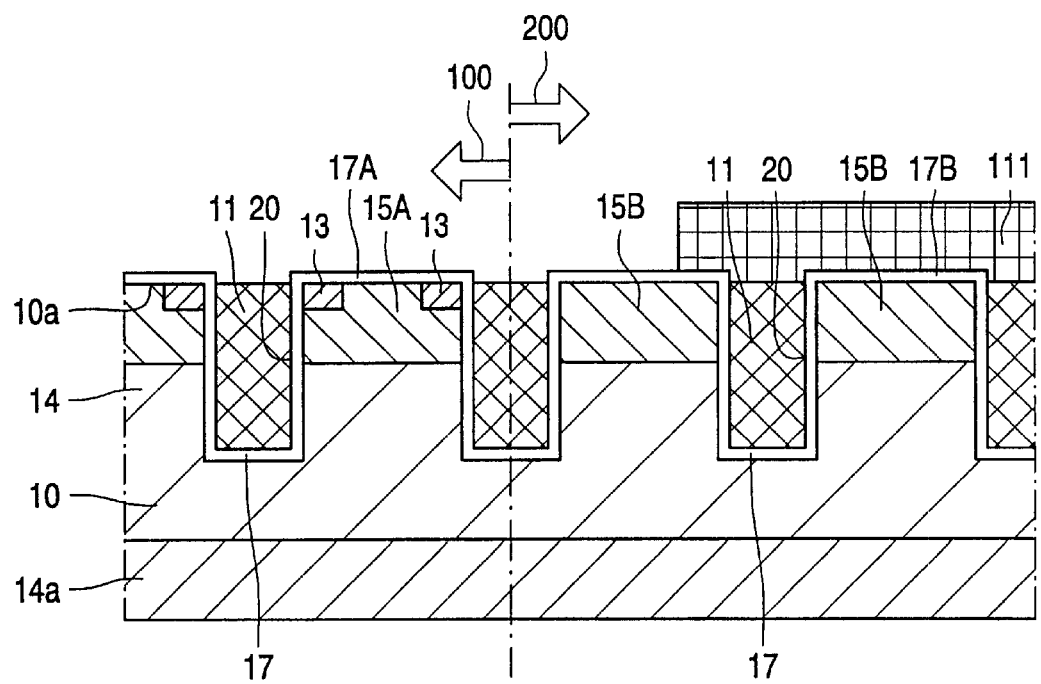
Figure 5:
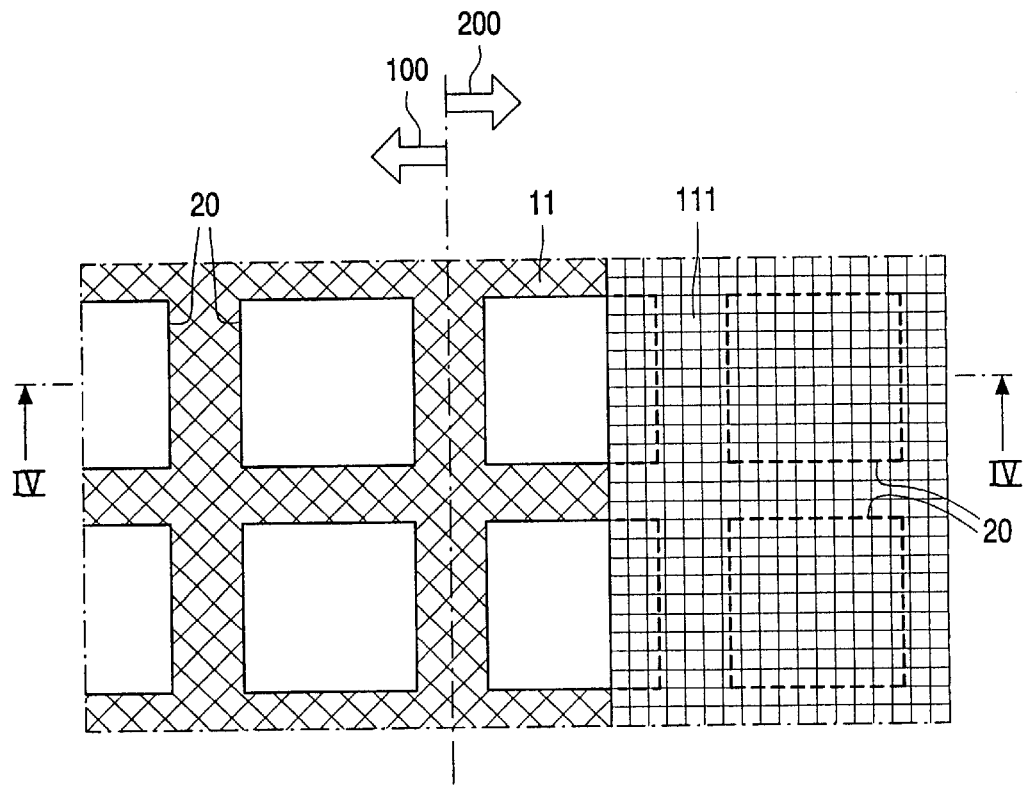
FIG. 5 is a plan view of the semiconductor body at the stage shown in FIG. 4, the line IV—IV indicating where the cross-section of FIG. 4 is taken.

The device of FIG. 6 is manufactured by a method which, in overview of FIGS. 1 to 6, includes the steps of:

(a) providing the semiconductor body 10 (typically of monocrystalline silicon) with a first layer 14 extending to the semiconductor body surface 10a in the active 100 and inactive 200 areas, the first layer 14 being of a first conductivity type (usually n-type) suitable for the transistor cell drain regions, see FIG. 1;

(b) forming the trenches 20 extending into the first layer 14 in the active 100 and inactive 200 areas, see FIGS. 1 and 2;

(c) while the first layer 14 still extends to the semiconductor body surface 10a, providing the insulating layer 17 in the trenches 20 in the active 100 and inactive 200 areas, and providing the top surface insulating layer 17B in the inactive area (layers 17 and 17B preferably both being silicon dioxide formed by oxidation of the first layer 14), see FIG. 1;

(d) depositing the gate material 11 in the trenches 20 and planarising the gate material 11 to the top of the trenches 20 in the active 100 and inactive 200 areas, see FIGS. 1 and 2;

(e) after steps (c) and (d), forming (typically using boron dopant implantation) a second layer 15A, 15B extending from the semiconductor body surface 10a in the active 100 and inactive 200 areas, the second layer 15A, 15B being of a second conductivity type (usually p-type) opposite to the first conductivity type, suitable for the channel-accommodating regions 15A in the active area 100, see FIG. 3;

(f) after step (e), forming (typically using arsenic dopant implantation) the source regions 13 in the active area 100, see FIG. 3; and (g) also after step (e), providing the further gate material 111 (typically doped polycrystalline silicon and the same composition as the gate material 11) in the inactive area 200, see FIGS. 4 and 5.

A further step then provides the source electrode 23 and the gate electrode 25, see FIG. 6.

Forming the second layer with the channel-accommodating regions 15A in the active area 100 in step (e) after providing the insulating layer 17 in the trenches 20, is advantageous in optimising the profile of the channel 12 in operation of the device, particularly in the case where the insulating layer 17 is formed by oxidation of the first layer 14. The reason is that forming the gate insulating layer 17 by oxidation of the semiconductor body 10 is a long and high temperature process to the extent that if the channel accommodating regions 15A were already present then the oxidation process would move the p-type dopant in the regions 15A and the n-type dopant in the layer 14 to significantly change their concentration next to the trenches 20 from what is intended. In particular, this oxidation process would draw the p-type dopant (boron) out of the channel 12 in the regions 15A and into the insulating oxide layer 17. This oxidation process would also change the length of the channel 12, that is the distance of the p-type region 15A between the n-type source region 13 and the n-type drain region 14 from what is intended. Performing an oxidation process for providing the gate insulating layer 17 before using dopant implantation to form the channel-accommodating regions 15A avoids the effects just described of dopants being moved by the oxidation process and therefore provides a channel 12 with a more uniform depth, a doping level more as intended and a length more as intended, that is to say the profile of the channel 12 is optimised.

Having the two separate steps (d) and (g) in the above overviewed method, that is depositing the planarising the gate material 11 to the top of the trenches 20 in step (d) and later providing the further gate material 111 in step (g), enables the intermediate step (e) which provides the second layer channel-accommodating regions 15A also to provide the second layer regions 15B in the inactive area 200 where they will be under the further gate material 111. If the regions 15B were not present then there would be a high concentration of electric field at the bottom corners 20A (see FIG. 6) of the trenches 20 in the inactive area 200 in operation of the device, and hence a decreased drain-source breakdown voltage of the device. This effect can be understood by considering isopotential lines which would be evenly spaced beneath the trenches 20 and the regions 15A in the active area 100 but which would be drawn towards the top surface 10a of the semiconductor body through the n-type layer 14 in the inactive area 200 by the electrode 25 connection to the further gate material 111, with a consequent concentration of these isopotential lines at the bottom corners 20A. The presence of the p-type regions 15B in the inactive area 200 prevents this drawing of isopotential lines to the top surface 10a and so counteracts the concentration of electric field at the trench bottom corners 20A. In order to obtain a better trade-off between specific on-resistance, that is drain-source resistance in the on-state, and drain-source breakdown voltage in these vertical power transistor devices the drift length, that is the depth of the n-type layer 14, can be minimised. As mentioned in the background art discussion of this specification, document U.S. Pat. No. 5,795,792 (Nishihara) also shows p-type regions underneath the gate electrode but these p-type regions extend below the trenches in the inactive area which results in a longer drift length than the minimum for a given drain-source breakdown voltage. In the exemplary embodiments of the present invention the regions 15B have the same depth as the channel-accommodating body regions 15A, and so this disadvantage of the Nishihara device is avoided. Also, as mentioned in the background art discussion of this specification, the inventive disclosure of Nishihara is concerned with voltage breakdown of the insulating layer at the trench top corners 20B (see FIG. 6 of our drawings) in the inactive area 200. It should be noted that the breakdown at the top corner of the trench is gate-source breakdown, and this is a different mechanism from breakdown at the bottom corner of the trench which is drain-source breakdown and/or gate-drain breakdown.

Successive stages in the manufacture of the device of FIG. 6 will now be described in detail with reference to FIGS. 1 to 6.

Referring to FIGS. 1 and 2, a monocrystalline silicon semiconductor body 10 is first provided having an n-type substrate region 14a of high conductivity on which there is formed an epitaxial high resistivity (low doped) n-type first layer 14 extending to the upper major surface 10a of the semiconductor body 10. The first layer 14 and the substrate 14a are present both in an active area 100, where there will be transistor cells and where the layer 14 will form transistor cell drain-drift regions, and in an inactive area 200. A mask (not shown) of, for example, silicon dioxide is formed on the surface 10a by forming a continuous thick layer using known deposition techniques, for example low pressure chemical vapour deposition, and then forming etch windows in this layer using known photolithography and etching techniques. Trenches 20 extending into the first layer 14 in the active 100 and inactive 200 areas are then formed by etching into the semiconductor body 10 at the etch windows of the mask, preferably using an anisotropic plasma etch. After forming the trenches 20, the silicon dioxide mask is removed.

While the first layer 14 still extends to the semiconductor body surface 10a, an insulating layer 17 is provided in the trenches 20 in the active 100 and inactive 200 areas and, at the same time, a top surface insulating layer 17A is provided on the semiconductor body surface 10a in the active area 100 and a top surface insulating layer 17B is provided on the semiconductor body surface 10a in the inactive area 200. Preferably the layers 17, 17A, 17B are silicon dioxide formed by deposition, or by dry oxidation of the silicon body 10, or by oxidation by wet oxide growth. Oxidation of the semiconductor body first layer 14 is the preferred method. Gate material 11, which may be doped polycrystalline silicon, is then deposited in the trenches 20 on the insulating layer 17 and on the top surface insulating layers 17A, 17B and then etched back level with the semiconductor body surface 10a. The deposited gate material 11 is thus planarised to the top of the trenches 20 in the active 100 and inactive 200 areas. In the active area 100 each trench 20 together with the layer 17, which is a gate insulating layer, and the gate material 11 forms a trench-gate structure to surround a transistor cell. FIG. 2 shows that the trenches 20, containing gate material 11, are formed as a connected trench network having the same pattern, surrounding square-shaped regions, in the active 100 and inactive 200 areas. Thus square-shaped transistor cells will be formed in the active area 100. Different known transistor cell geometries may be used. Thus for example the cells may have a hexagonal or an elongate stripe geometry.

Referring now to FIG. 3, dopant implantation is then used to form a second, p-type, layer 15A, 15B extending from the semiconductor body surface 10a in the active 100 and inactive 200 areas. This is acceptor ion (for example boron) implantation over the whole of the active 100 and inactive 200 areas. Within the trenches 20, the implanted ion dose is low enough not to influence the conductivity of the doped polycrystalline gate material 11. Within the square-shaped regions surrounded by the trenches 20, the implantation is through the silicon dioxide top surface insulating layers 17A and 17B. The layers 17A, 17B protect the silicon body surface 10a from contamination during implantation, and also advantageously act as a screen to suppress channelling of the boron ions during implantation. The implantation is followed by a heating treatment for annealing and then diffusing the implanted layer 15A, 15B so that p-type channel-accommodating regions 15A are formed to the required depth in the active area 100 and p-type regions 15B are formed to the same depth under the top surface insulating layer 17B in the inactive area 200. Donor dopant (for example phosphorous or arsenic) ion implantation, followed by annealing and diffusion, is then used to form n-type source regions 13 in the active area 100. For this purpose a mask (not shown) is formed by depositing a continuous layer of resist material and then forming windows in this layer in a standard manner using photolithography and etching. These windows have an annular shape in the square-shaped areas surrounded by the trenches 20 in the active area 100, and the donor implantation is through these annular windows. After forming the annular source regions 13, the resist mask is removed. It is envisaged that an implantation mask formed by a self-alignment process could be used for forming the source regions 13 instead of the resist mask just described.

Referring now to FIGS. 4 and 5, further gate material, which may be doped polycrystalline silicon, is deposited on the whole of the active 100 and inactive 200 areas and then patterned using a resist mask and etching to leave this further gate material 111 in contact with and extending from the gate material 11 in the trenches 20 and onto the top surface insulating layer 17B in the inactive area 200 in a direction away from the active area 100. The resist mask is then removed to expose the top surface of the further gate material 111. Allowing the further gate material 111 to contact part of the top surface insulating layer 17B in a direction towards the active area 100 as shown in FIGS. 4 and 5 allows for a less critical alignment of the resist mask used for patterning this further gate material 111. The gate material 11 and the further gate material 111 preferably have the same composition, for example polycrystalline silicon which is preferentially doped either in-situ or by implantation or diffusion. However, the gate material 11 and the further gate material 111 could have different compositions, for example the further gate material 111 could possibly be metal.

Referring now to FIG. 6, except where the top surface insulating layer 17B is covered by the further gate material 111, the top surface insulating layers 17A and 17B are removed by etching to expose the top surface 10a of the semiconductor body. A new layer of insulating material, for example silicon dioxide, is then deposited on the active 100 and inactive 200 areas and this is patterned using a resist mask and etching to provide gate insulating overlayers 18 in the active area 100, a passivation insulating layer 18A on the semiconductor body surface 10a in the inactive area 200 where the further gate material 111 is not present, and an insulating layer 18B on the further gate material 111 where it is not to be contacted by an electrode. Electrode material (for example aluminium) is then deposited and patterned to provide a source electrode 23 and a gate electrode 25. The source electrode 23 contacts the top surface of the annular source region 13 and the adjacent top surface of the channel-accommodating body region 15A within each transistor cell, and the source electrode 23 is insulated from the gate material 11 in the trenches 20 surrounding the transistor cells by the gate insulating overlayers 18. Also, in practice, the source electrode 23 is present on the insulating layer 18A and is partly present on the insulating layer 18B overlapping the edge of the further gate material 111. The gate electrode 25 is partly present on the insulating layer 18B and contacts the further gate material 111.

FIG. 6 shows the regions 15B of the p-type second layer in the inactive area 200 as isolated cells each being surrounded by the network of trenches 20 and not contacted by the source electrode 23. It can be better not to have these regions 15B as electrically floating regions, and a modified method and device structure for this purpose will now be described.

Figure 7:
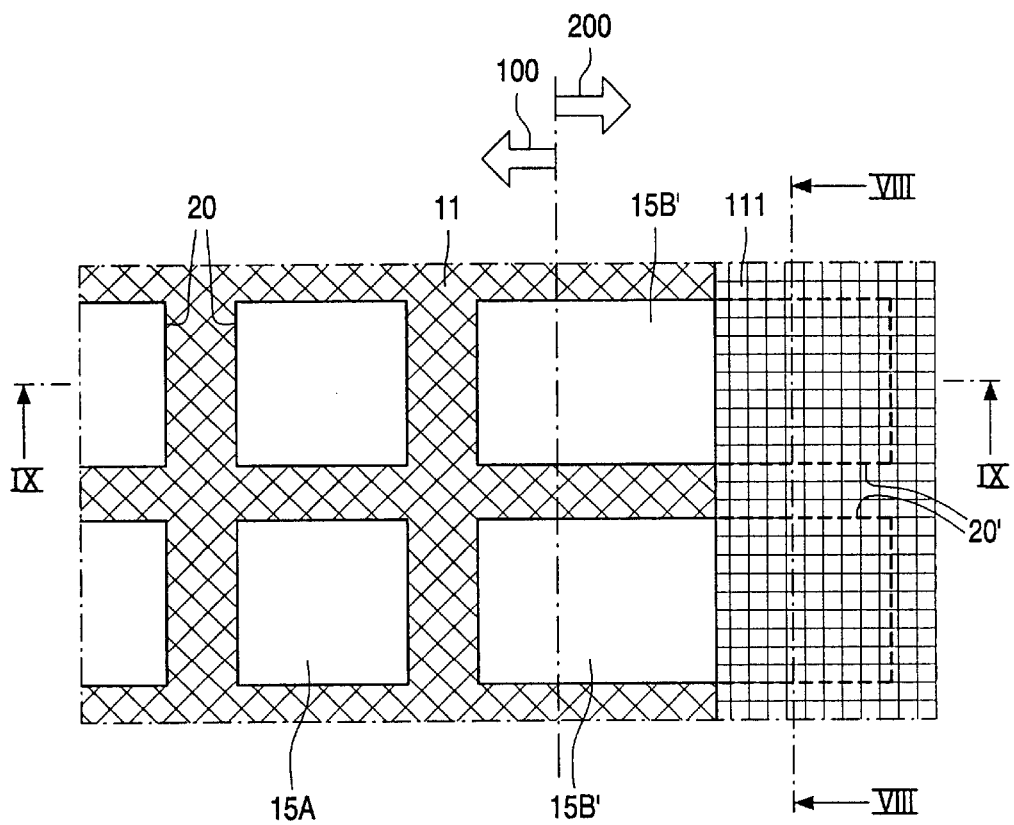
FIG. 7 is a plan view of the semiconductor body at a stage corresponding to that shown in FIG. 5, but modified in a second example of a method in accordance with the invention.

FIG. 7 is a plan view of the semiconductor body at a stage corresponding to that shown in FIG. 5, but modified as follows. The trenches in the inactive area 200 as shown in FIG. 7 are formed as a pattern of stripe-shaped trenches 20' extending from the active area 100 to the inactive area 200, and stripe-shaped regions 15B' of the p-type second layer are formed to extend between the stripe-shaped trenches 20' from the active area 100 to the inactive area 200.

Figure 8:
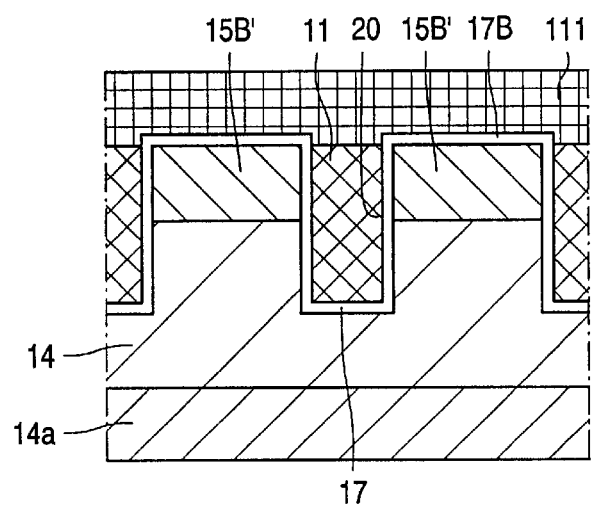
FIG. 8 is a cross-sectional view of the semiconductor body taken on the line VIII—VIII shown in FIG. 7.

FIG. 8 is a cross-sectional view of the semiconductor body taken on the line VIII—VIII shown in FIG. 7. This Figure shows the further gate material 111 in contact with and extending from the gate material 11 in the trenches 20' and onto the top surface insulating layer 17B over the regions 15B' in the inactive area 200.

Figure 9:
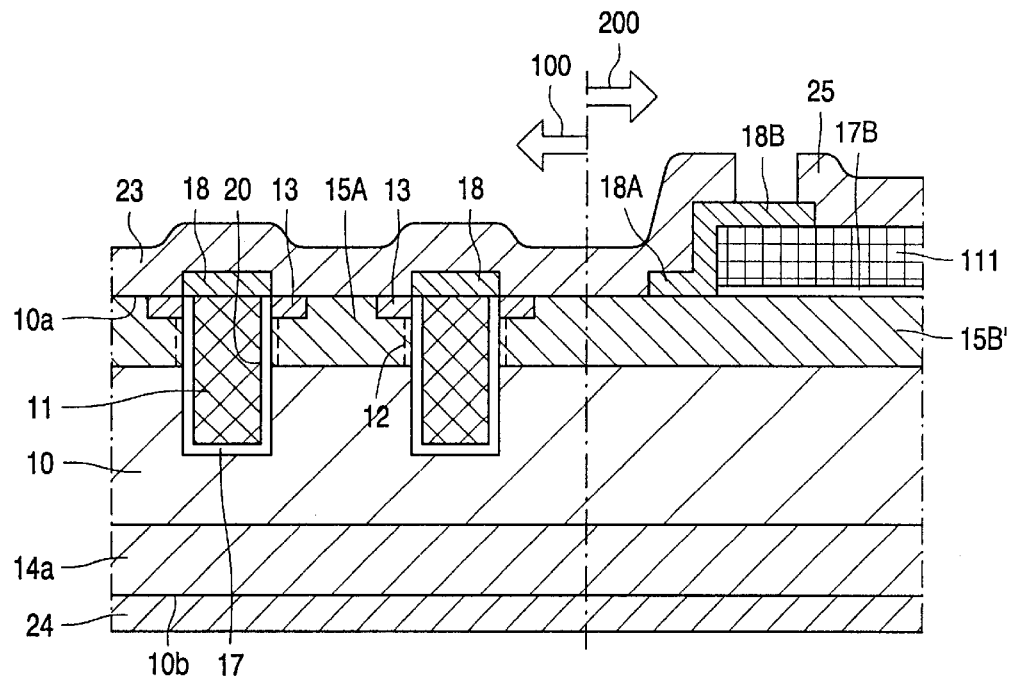
FIG. 9 shows a cross-sectional view of the semiconductor body at the stage corresponding to FIG. 6 but modified in accordance with the second example of the method, the line IX—IX in FIG. 7 indicating where the cross-section of FIG. 9 is taken, FIG. 9 showing a second example of part of a vertical power transistor in accordance with the invention.

FIG. 9 shows a cross-sectional view of the semiconductor body at the stage corresponding to FIG. 6 but modified as just described with reference to FIGS. 7 and 8, the line IX—IX in FIG. 7 indicating where the cross-section of FIG. 9 is taken through one of the stripe-shaped regions 15B'. This Figure shows how the source electrode 23 contacts the stripe-shaped p-type regions 15B' at the semiconductor body surface 10a so that these regions are not electrically floating.

In the first method described above with reference to FIGS. 1 to 6, and in the second, modified, method as described with reference to FIGS. 7 to 9, the device gate material 11 and the device further gate material 111 are provided in two separate steps, respectively before and after forming the second, p-type, layer 15A, 15B in the active 100 and inactive 200 areas. The material 11 which is deposited and planarised, as described with reference to FIGS. 1 and 2, may be considered as a first material which remains to provide the device gate material. In a third method, which will be described with reference to FIGS. 10 to 12, both the first and second methods may be modified in that this first material which is deposited and planarised before forming the second layer 15A, 15B is afterwards removed from the trenches 20, and then a second material is deposited in the trenches 20 and on the top surface insulating layers 17A, 17B, this second material then being patterned so as to provide the device gate material and the device further gate material in a single step.

Figure 10:
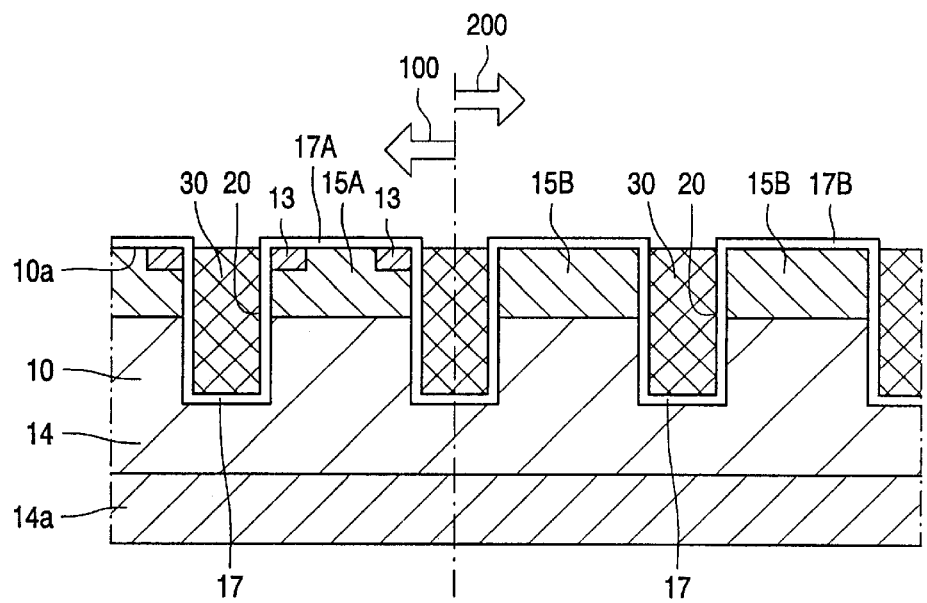
FIG. 10 shows a cross-sectional view of the semiconductor body at a stage corresponding to that shown in FIG. 3, but modified in a third example of a method in accordance with the invention.

Referring now to FIG. 10, there is shown a cross-sectional view of the semiconductor body 10 at a stage corresponding to that shown in FIG. 3, but modified in accordance with the third method as outlined above. In this third method, the steps described with reference to FIGS. 1 and 2 still apply except that, instead of the material 11 which will remain to provide the device gate material being deposited and planarised in the trenches 20, a first material 30 which will not remain to provide the device gate material is deposited and planarised in the trenches 20. The second layer 15A, 15B is formed using dopant ion implantation and diffusion in the same manner as has been described with reference to FIG. 3, and the source regions 13 are formed in the same manner as has been described with reference to FIG. 3. The purpose of the material 30 is to act only as a stopping layer which prevents the dopant implanted to form the second layer 15A, 15B being implanted through the bottom of the trenches 20 into the region 14. The material 30 may be, for example spin-on-glass or resist material or polycrystalline silicon.

Figure 11:
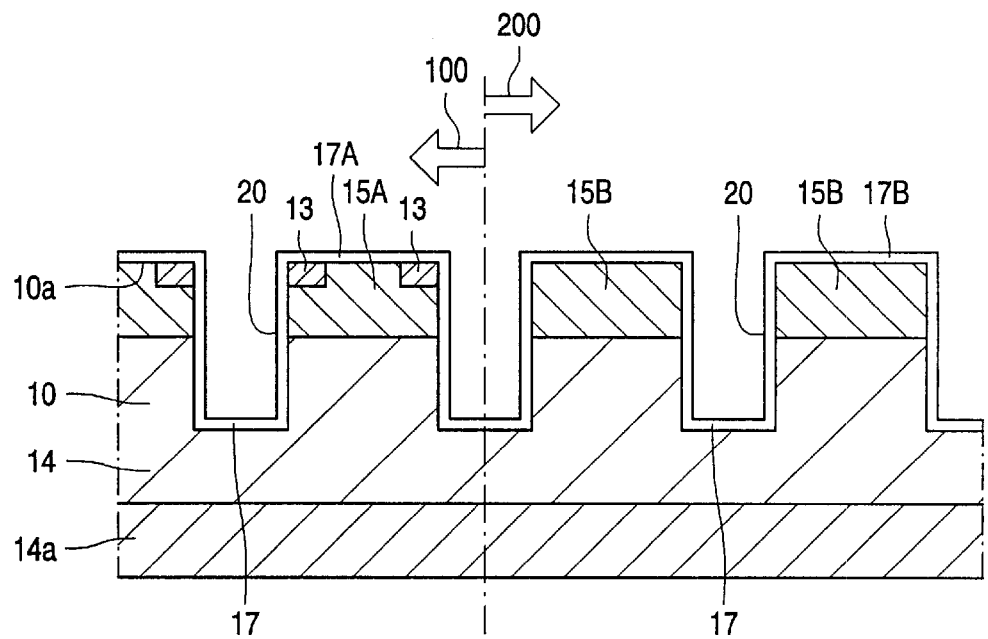
FIG. 11 shows a cross-sectional view of the semiconductor body at a following stage in accordance with the third example of the method.

As shown in FIG. 11, the material 30 is then removed by etching from the trenches 20 in the active 100 and inactive 200 areas.

Figure 12:
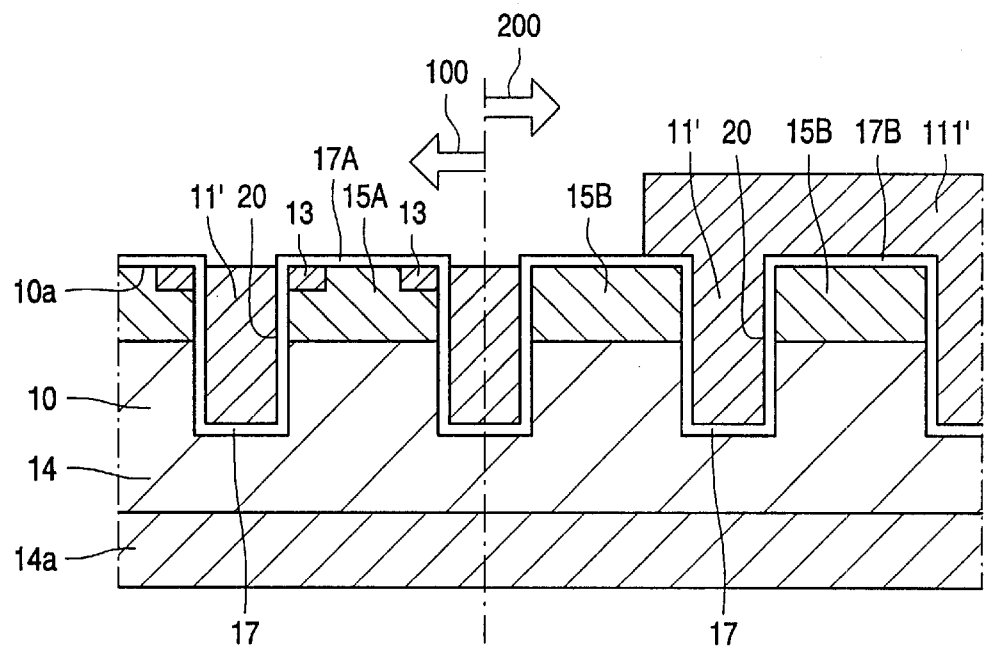
FIG. 12 shows a cross-sectional view of the semiconductor body at a stage corresponding to that shown in FIG. 4 but modified in accordance with the third example of the method.

Referring now to FIG. 12, there is shown a cross-sectional view of the semiconductor body 10 at a stage corresponding to that shown in FIG. 4 but modified in accordance with the third method as outlined above. After removing the first material 30 from the trenches 20, a second material is deposited in the trenches 20 and on the top surface insulating layers 17A, 17B on the whole of the active 100 and inactive 200 areas. This second material is then patterned in a single step using a resist mask and etching to provide the device gate material 11' in the trenches 20 in the active area 100 and to provide the device gate material 11' in the trenches 20 in the inactive area 200 extending to the device further gate material 111' on the top surface insulating layer 17B. The same method steps as have been described with reference to FIG. 6 may be applied to the structure of FIG. 12 to produce the completed device.

The second material used to provide the device gate material 11' and the device further gate material 111' in a single step as just described may be, for example, doped polycrystalline silicon. Alternatively, this second material may be metal. One advantage of having metal gate material is that the gate resistance of the device may be made lower than for a polycrystalline silicon gate device. Also, different metals have different work functions and can be used to provide devices with different threshold voltages.

Variations and modifications of the above-described power transistors and their methods of manufacture, within the scope of the present invention, including the following. In the above-described examples, the p-type second layer 15A, 15B is formed by dopant ion implantation through the surface insulating layers 17A, 17B and this is the preferred method. However, the layer 15A, 15B could instead be formed by diffusion only, for example from a heavily doped glass through the layers 17A, 17B. Another possibility is to remove the layers 17A, 17B before forming the layer 15A, 15B by diffusion from a vapour phase; another layer 17B afterwards being provided before providing the further gate material 111 in the first and second exemplary methods or before providing the gate material 11' and further gate material 111' in the third exemplary method. Instead of n-type conductivity source and drain regions separated by a p-type conductivity channel-accommodating region, the source and drain regions may be p-type with the channel-accommodating region being n-type. At least some of the transistor cells may have a localised region of opposite conductivity type to the source and drain regions, the localised region extending into the semiconductor body to the drain region and being separated from the trench-gate by the channel-accommodating region. In the usual type of device, the localised regions protect the cells against turning on of their in-built parasitic bipolar transistors.

What is claimed is:

1. A method of manufacturing a vertical power transistor trench-gate semiconductor device, the device comprising:

a semiconductor body with trenches extending into the semiconductor body from a surface thereof and an insulating layer provided between gate material in the trenches and the semiconductor body adjacent the trenches;

wherein the device has an active transistor cell area, each transistor cell having source and drain regions which are separated by a channel-accommodating body region adjacent a trench-gate, and a source electrode contacting the source regions on the semiconductor body surface and being insulated from the gate material in the trenches; and wherein the device has an inactive area without source regions, said insulating layer extending from the trenches to provide a top surface insulating layer on the semiconductor body surface in the inactive area, further gate material extending from the gate material in the trenches in the inactive area and onto the top surface insulating layer, and a gate electrode contacting the further gate material;

the method including the steps of:

(a) providing the semiconductor body with a first layer extending to the semiconductor body surface in the active and inactive areas, the first layer being of a first conductivity type suitable for the drain regions;

(b) forming the trenches extending into the first layer in the active and inactive areas;

(c) while the first layer still extends to the semiconductor body surface, providing the insulating layer in the trenches in the active and inactive areas, and providing the top surface insulating layer in the inactive area;

(d) depositing a first material in the trenches and planarising the first material to the top of the trenches in the active and inactive areas;

(e) after steps (c) and (d), forming a second layer extending from the semiconductor body surface in the active and inactive areas, the second layer being of a second conductivity type, opposite to the first conductivity type, suitable for the channel-accommodating body regions in the active area;

(f) after step (e), forming the source regions in the active area; and (g) also after step (e), providing the further gate material in the inactive area.

2. A method as claimed in claim 1, wherein in step (c) the insulating layer in the trenches and the top surface insulating layer in the inactive area are formed by oxidation of the semiconductor body first layer.

3. A method as claimed in claim 1, wherein the first material which is deposited and planarised in step (d) is the device gate material.

4. A method as claimed in claim 3, wherein the first material is polycrystalline silicon.

5. A method as claimed in claim 3, wherein the gate material and the further gate material have the same composition.

6. A method as claimed in claim 1, wherein after step (e) and before step (g) the first material is removed from the trenches, and wherein in step (g) a second material is deposited in the trenches and on the top surface insulating layer in the inactive area, and the second material is patterned to provide the device gate material and the device further gate material.

7. A method as claimed in claim 6, wherein the second material is polycrystalline silicon.

8. A method as claimed in claim 6, wherein the second material is metal.

9. A method as claimed in claim 1, wherein in step (c) the insulating layer in the trenches, the top surface insulating layer in the inactive area and a further top surface insulating layer in the active area are formed simultaneously, and wherein the second layer is formed in step (e) using dopant implantation through the top surface insulating layer and through the further top surface insulating layer.

10. A method as claimed in claim 9, wherein the source regions are formed in step (f) an using dopant implantation through the further top surface insulating layer, and wherein the further top surface insulating layer is removed before providing the source electrode.

11. A method as claimed in claim 1, wherein in step (f) an applied mask is used to define areas for the source regions.

12. A method as claimed in claim 1, wherein the source electrode is insulated from the gate material in the trenches by prior application and patterning of insulating material to provide gate insulating overlayers in the active area.

13. A method as claimed in claim 1, wherein the trenches are formed as a connected trench network having the same pattern in the active and inactive areas, the transistor cells in the active area each being surrounded by the trench network and contacted by the provided source electrode at the semiconductor body surface, and isolated cells of the second layer in the inactive area each being surrounded by the trench network and not contacted by the provided source electrode.

14. A method as claimed in claim 1, wherein the trenches in the inactive area are formed as a pattern of stripe-shaped trenches extending from the active area to the inactive area, wherein stripe-shaped regions of the second layer are formed to extend between the stripe-shaped trenches from the active area to the inactive area, and wherein the source electrode is provided to contact the stripe-shaped regions of the second layer at the semiconductor body surface.

* * * * *